(12) United States Patent
Lee et al.

(10) Patent No.: US 9,368,470 B2
(45) Date of Patent: Jun. 14, 2016

(54) COATED BONDING WIRE AND METHODS FOR BONDING USING SAME

(71) Applicant: FREESCALE SEMICONDUCTOR, INC., Austin, TX (US)

(72) Inventors: Chu-Chung Lee, Round Rock, TX (US); Burton J. Carpenter, Austin, TX (US); Tu-Anh N. Tran, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/529,744

(22) Filed: Oct. 31, 2014

(65) Prior Publication Data

US 2016/0126208 A1    May 5, 2016

(51) Int. Cl.
| | |
|---|---|
| H01L 23/48 | (2006.01) |
| H01L 23/52 | (2006.01) |
| H01L 29/40 | (2006.01) |
| H01L 21/44 | (2006.01) |
| H01L 23/00 | (2006.01) |
| H01L 23/31 | (2006.01) |

(52) U.S. Cl.
CPC ............ *H01L 24/45* (2013.01); *H01L 23/3107* (2013.01); *H01L 24/48* (2013.01); *H01L 24/85* (2013.01); *H01L 2224/4555* (2013.01); *H01L 2224/45139* (2013.01); *H01L 2224/45147* (2013.01); *H01L 2224/45572* (2013.01); *H01L 2224/45573* (2013.01); *H01L 2224/45618* (2013.01); *H01L 2224/45623* (2013.01); *H01L 2224/45624* (2013.01); *H01L 2224/45664* (2013.01); *H01L 2224/484* (2013.01); *H01L 2224/4845* (2013.01); *H01L 2224/48455* (2013.01)

(58) Field of Classification Search
CPC ............ H01L 29/0657; H01L 2924/14; H01L 2924/3011; H01L 2924/01079; H01L 2924/01029; H01L 2924/01013; H01L 2924/01078; H01L 23/485; H01L 23/3171; H01L 23/53238; H01L 2224/48091; H01L 21/28518
USPC .......... 438/106, 118, 612, 617, 614; 257/618, 257/626, 678, 690, 693, 734, 738, 741, 750, 257/762, 768, 780, 784, 786
See application file for complete search history.

(56) References Cited

U.S. PATENT DOCUMENTS

| | | |
|---|---|---|
| 7,138,328 B2 | 11/2006 | Downey et al. |
| 7,360,675 B2 | 4/2008 | Persic et al. |
| 8,247,911 B2 | 8/2012 | Uno et al. |
| 8,372,741 B1 * | 2/2013 | Co .......................... H01L 24/03 219/56.22 |
| 2010/0105850 A1 * | 4/2010 | Mance ................ C07D 213/22 526/113 |

FOREIGN PATENT DOCUMENTS

WO    2013076548 A1    5/2013

* cited by examiner

*Primary Examiner* — Hsien Ming Lee

(57) ABSTRACT

A semiconductor device includes a bond formed on a bond pad. The bond is formed of a wire that includes a central core of conductive metal, a first coating over the central core of conductive metal that is more chemically active than the conductive metal, and a second coating over the central core of conductive metal that is less chemically active than the central core of conductive metal.

19 Claims, 3 Drawing Sheets

COATED BONDING WIRE AND METHODS FOR BONDING USING SAME

BACKGROUND

1. Field

This disclosure relates generally to bonding structures on semiconductor devices, and more specifically, to a coated bonding wire and methods for bonding using the same.

2. Related Art

When creating wire bonds in semiconductor devices, oxidation of the wire's base material may occur due to the stresses placed on the wire during the bonding process. One approach to improving the bonding process has been to coat the wire with materials more resistant to oxidation. However, stresses on the wire during the bonding process may still create openings in the coating, leaving the underlying wire material(s) open to oxidation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

When creating wire bonds in a semiconductor device, certain mechanical stresses may be placed on the wire during the bonding process. For example, in a ball bonding process, a free-air ball may be formed and then pressed down onto a bond pad by a capillary chamfer. In a stitch bond, a capillary may press down on a portion of the wire in order to form the bond. Other types of wire bonding may result in different types of stresses. When using certain types of wires, these stressing forces may result in cracks or openings of certain layers or coatings of the wire, resulting in localized exposure of the underlying wire core to oxidation. For example, a common wire used in wire bonding is a palladium (or palladium alloy) coated copper wire. During the wire bonding process, cracks or other discontinuities in the palladium coating may be introduced during the bonding process. These discontinuities may result in localized exposure of the underlying copper, making the copper more susceptible to oxidation.

The wire bonding process chosen may depend on a variety of factors, including wire material (e.g., Copper, Aluminum, Silver, Gold, etc.), bonding surface material (e.g., Aluminum, Aluminum alloys, Gold, Gold alloys, Silver, Silver alloys, etc.), bonding surface type (e.g., semiconductor substrate, package substrate, etc.), design considerations, etc. For example, when performing a ball bond process bonding a copper wire to an aluminum die pad (e.g., a first bond in a ball bond process), an aluminum-copper intermetallic compound may form between the copper and aluminum, with a ball bond being preferred for that particular connection. Using the same example, when terminating the copper wire at a nickel/gold pad on a package substrate (e.g., a second bond in a ball bond process), a Copper-Gold intermetallic compound may form in a stitch bond form. In some configurations, an intermetallic may still form between a Copper wedge and an Aluminum surface.

The semiconductor described herein can be any semiconductor material or combinations of materials, such as gallium arsenide, silicon germanium, silicon-on-insulator (SOI), silicon, monocrystalline silicon, the like, and combinations of the above. The package substrate described here can be comprised of a copper or copper alloy leadframe, or ball grid array substrate made of epoxy, plastic, FR-4, FR5, a Bismaleimide-Triazine resin, a fiberglass reinforced epoxy laminate, polytetrafluorethylene, ceramic, polyimide, or other suitable material.

Figure 1:
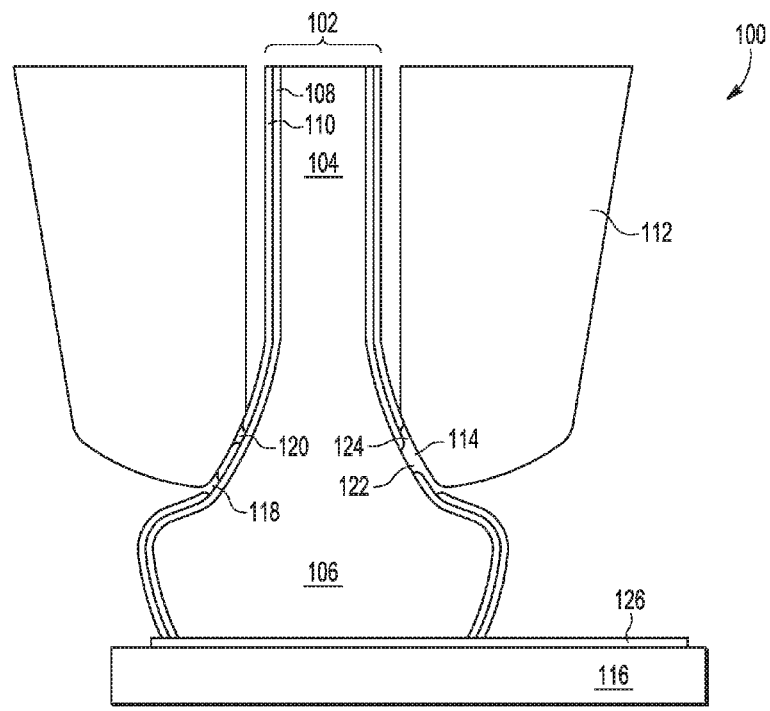
FIG. 1 illustrates an example semiconductor device including a wire bonded to a bond pad via a ball bond, in accordance with certain embodiments of the present disclosure.

FIG. 1 illustrates an example semiconductor device 100 including a wire 102 bonded to a bond pad 126 via ball bond 106, in accordance with certain embodiments of the present disclosure. In some embodiments, bond pad 126 may be an aluminum bond pad and/or any other appropriate material. Bond pad 126 may also overlay substrate 116. Substrate 116 may be a silicon substrate or any other appropriate substrate operable to support bond pad 126.

In some embodiments, ball bond 106 may be formed by the application of force by capillary 112 pressing down on portions of a free air ball formed from portions of wire 102, as described in more detail below with reference to FIGS. 3-6. Capillary 112 may be any appropriate structure operable to direct the free air ball such that the ball may be bonded to bond pad 126. For example, capillary 112 may include a chamber surrounding wire 102, wherein the outer surface of the chamber includes a region 114 that tapers toward the free air ball at the end of wire 102. Once the free air ball comes into contact with bond pad 126, capillary 112 may deform some or all of the free air ball in order to facilitate bonding to bond pad 126, resulting in ball bond 106.

In some embodiments, wire 102 may include a central core material 104 covered in a plurality of layers 108, 110. Core material 104 may be any appropriate conductive material, including copper, silver, and/or their alloys. Core material 104 may be a material that is susceptible to corrosion. Core material 104 may, therefore be covered by a layer designed to protect core material 104 from potential corrosive effects. For example, a common bonding wire includes a layer of palladium overlying the copper core material.

Referring again to FIG. 1, wire 102 includes core material 104 covered in a plurality of layers 108, 110. One of layers 108, 110 may be a sacrificial coating layer composed substantially of a material that is more chemically active than core material 104. For example, if core material 104 is copper, then the sacrificial coating layer may be composed substantially of zinc, aluminum, magnesium, or other material more chemically active than copper. The other of layers 108, 110 may be a coating layer composed substantially of a material that is less chemically active than core material 104. For example, if core material 104 is copper, then the coating layer may be composed substantially of palladium.

Generally, a first material may be described as more chemically active than a second material when the first has a lower reduction potential than the second. Alternatively, a first material may be described as more chemically active than a second material when the first has a lower standard electrode potential than the second. For example, the table below provides an example electrochemical series wherein a plurality of example materials are listed in order of decreasing chemical activity.

TABLE 1

| Equilibrium | E° (Volts) |
| --- | --- |
| $Cu^{2+}(aq) + 2e^- \rightarrow Cu(s)$ | +0.340 |
| $SO_4^{2-}(aq) + 4H^+(aq) + 2e^- \rightarrow 2H_2O(l) + SO_2(g)$ | +0.17 |
| $Sn^{4+}(aq) + 2e^- \rightarrow Sn^{2+}(aq)$ | 0.154 |
| $S(s) + 2H^+(aq) + 2e^- \rightarrow H_2S(g)$ | +0.14 |
| $2H^+(aq) + 2e^- \rightarrow H_2(g)$ | 0 |
| $Pb^{2+}(aq) + 2e^- \rightarrow Pb$ | −0.125 |
| $Sn^{2+}(aq) + 2e^- \rightarrow Sn(s)$ | −0.137 |
| $Fe^{2+}(aq) + 2e^- \rightarrow Fe(s)$ | −0.440 |
| $Zn^{2+} + 2e^- \rightarrow Zn(s)$ | −0.763 |
| $Al^{3+}(aq) + 3e^- \rightarrow Al(s)$ | −1.676 |
| $Mg^{2+}(aq) + 2e^- \rightarrow Mg(s)$ | −2.356 |
| $Na^+(aq) + e^- \rightarrow Na(s)$ | −2.713 |
| $Ca^{2+}(aq) + 2e^- \rightarrow Ca(s)$ | −2.84 |
| $K^+(aq) ++ e^- \rightarrow K(s)$ | −2.924 |
| $Li^+(aq) + e^- \rightarrow Li(s)$ | −3.040 |

In some embodiments, the application of pressure by capillary 112 on the free air ball to form ball bond 106 may result in openings 118, 120, 122, 124 being formed in layers 108, 110. In prior bonding methods, openings in coating layers may result in localized exposure of core material 104 to oxidation. This may result in reduced electrical performance of ball bond 106 and/or wire 102.

Referring again to FIG. 1, although openings 118, 120, 122, 124 may still form during a ball bonding process, the sacrificial layer may act to oxidize more readily than core material 104. As a result, the oxidation of core material 104 may be reduced or not occur.

In some embodiments, layer 108 may be the sacrificial layer. For example, wire 102 may include a layer of zinc over core material 104. The layer of zinc may be of any appropriate thickness such that a sacrificial layer is provided while still being able to be selectively removed, as described in more detail below with reference to FIG. 3. For example, the layer of zinc may be approximately 0.05-0.20 microns thick. In a configuration in which layer 108 is the sacrificial layer, layer 110 may be the coating layer. For example, wire 102 may include a layer of palladium over the layer of zinc.

In the same or alternative embodiments, layer 110 may be the sacrificial layer. In such a configuration, layer 108 may be the coating layer. For example, wire 102 may include a layer of palladium over core material 104 and a layer of zinc over the layer of palladium. The layer of zinc may be of any appropriate thickness such that a sacrificial layer is provided while still being able to be selectively removed, as described in more detail below with reference to FIG. 3. For example, the layer of zinc may be approximately 0.05-0.20 microns thick.

In still further embodiments, layers 108, 110 may include a plurality of other layers. For example, as described in more detail below with reference to FIG. 4, wire 102 may include a first coating layer over core material 104, a sacrificial layer over the first coating layer, and a second coating layer over the sacrificial layer. For example, wire 102 may include a first coating layer of palladium over a copper core, a sacrificial layer of zinc over the first palladium layer, and a second coating layer of palladium over the sacrificial layer.

The configuration of wire 102 may vary depending on a variety of design factors, as described in more detail below with reference to FIG. 2-6. For example, processing and handling considerations may be taken into account such that leaving the sacrificial layer exposed (e.g., as layer 110) is not feasible and a protective coating may be desired. As an additional example, as described in more detail below and with reference to FIG. 2-6, it may be desirable to have a coating layer material that improves electrical performance of ball bond 106. In such a configuration, it may be desirable to arrange the coating and/or sacrificial layer(s) such that some portion of a coating layer remains between ball bond 106 and bond pad 126. For example, it may be desirable to have a relatively thin layer of palladium remain at the bottom of the free air ball to aid in the bonding process between ball bond 106 and bond pad 126.

Further, in some embodiments, wire 102 may include one or more adhesion promotion layers in order to improve adhesion between layers 108, 110. For example, in order to improve adhesion between zinc and palladium, an adhesion promotion process, catalyst, and/or other material may be used. In the same or alternative embodiments, wire 102 may include one or more barrier layers in order to prevent diffusion between the sacrificial layer(s) and core material 104. For example, wire 102 may include a barrier layer between a zinc sacrificial layer and a copper core.

With reference to FIG. 1, forces provided by capillary 112 may result in example openings 118, 120, 122, 124 being formed in one or more of layers 108, 110. Although four openings are illustrated in FIG. 1, more, fewer, and/or different openings may be present in a given configuration of semiconductor device 100.

For example, semiconductor device 100 may include example openings 118, 120 in layer 110 on a first side of ball bond 106. Openings 118, 120 may result in the exposure of portions of layer 108. Semiconductor device 100 may also include example openings 122, 124 on a second side of ball bond 106. Opening 122 may be an opening in layer 108 and opening 124 may be an opening in layer 110. Openings 122, 124 may result in exposure of certain portions of layers 108, 110 as well as certain portions of core material 104.

With reference to openings 118, 120, layer 108 may act as an additional barrier for core material 104, reducing the potential oxidation of core material 104. Openings 118, 120 may result in oxidation of the sacrificial layer (whether it is present as layer 108 or as layer 110). With reference to openings 122, 124, portions of core material 104 may be exposed. In such a configuration, the sacrificial layer may act to reduce oxidation of core material 104 by being more chemically active than core material 104, thus providing an easier oxidation target than core material 104. Oxidation of core material 104 may thus be reduced even when the stresses of the bonding process are sufficient to create openings in layers 108, 110.

Although FIG. 1 illustrates an example semiconductor device 100 including ball bond 106, other wire bonding processes may be used without departing from the scope of the present disclosure.

Figure 2:
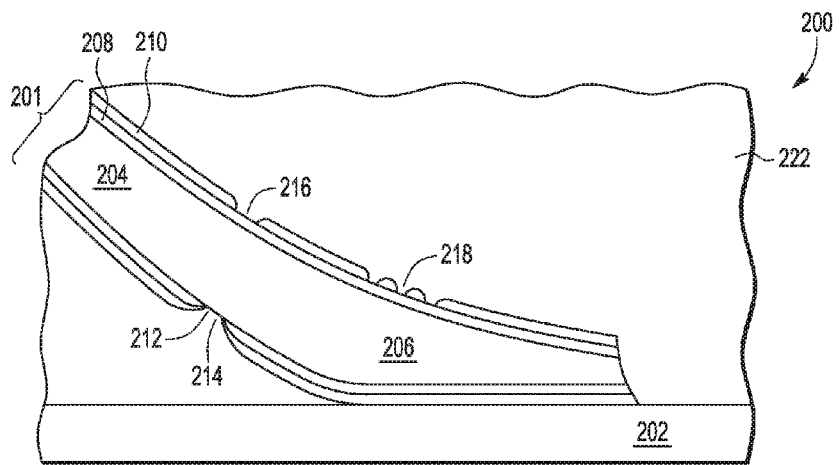
FIG. 2 illustrates an example semiconductor device including a wire bonded to a substrate via a stitch bond, in accordance with certain embodiments of the present disclosure.

FIG. 2 illustrates an example semiconductor device 200 including wire 201 bonded to substrate 202 via stitch bond 206, in accordance with certain embodiments of the present disclosure. Stitch bond 206 may be formed by the application of force by a capillary in a stitch bonding process. In some embodiments, stitch bond 206 may be substantially covered by mold compound 222. As described in more detail above with reference to FIG. 1, the capillary forces may result in openings 212, 214, 216, 218 being formed in one or more of layers 208, 210 over core material 204.

As described in more detail above with reference to FIG. 1, wire 201 may include a central core material 204 covered in a plurality of layers 208, 210. Core material 204 may be any appropriate conductive material, including copper, silver, and/or their alloys. Core material 204 may be a material that is susceptible to corrosion. Core material 204 may, therefore be covered by a layer designed to protect core material 204 from potential corrosive effects. For example, a common bonding wire includes a layer of palladium overlying the aluminum core material.

Referring again to FIG. 2, wire 201 includes core material 204 covered in a plurality of layers 208, 210. One of layers 208, 210 may be a sacrificial coating layer composed substantially of a material that is more chemically active than core material 204. For example, if core material 204 is copper, then the sacrificial coating layer may be composed substantially of zinc, aluminum, magnesium, or other material more chemically active than copper. The other of layers 208, 210 may be a coating layer composed substantially of a material that is less chemically active than core material 204. For example, if core material 204 is copper, then the coating layer may be composed substantially of palladium.

Although openings 212, 214, 216, 218 may form during a bonding process, the sacrificial layer may act to oxidize more readily than core material 204. As a result, the oxidation of core material 204 may be reduced.

In some embodiments, layer 208 may be the sacrificial layer. For example, wire 201 may include a layer of zinc over core material 204. The layer of zinc may be of any appropriate thickness such that a sacrificial layer is provided while still being able to be selectively removed, as described in more detail below with reference to FIG. 2. For example, the layer of zinc may be approximately 0.05-0.20 microns thick. In a configuration in which layer 208 is the sacrificial layer, layer 210 may be the coating layer. For example, wire 201 may include a layer of palladium over the layer of zinc.

In the same or alternative embodiments, layer 210 may be the sacrificial layer. In such a configuration, layer 208 may be the coating layer. For example, wire 201 may include a layer of palladium over core material 204 and a layer of zinc over the layer of palladium. The layer of zinc may be of any appropriate thickness such that a sacrificial layer is provided while still being able to be selectively removed, as described in more detail below with reference to FIG. 3. For example, the layer of zinc may be approximately 0.05-0.20 microns thick.

In still further embodiments, layers 208, 210 may include a plurality of other layers. For example, as described in more detail below with reference to FIG. 4, wire 201 may include a first coating layer over core material 204, a sacrificial layer over the first coating layer, and a second coating layer over the sacrificial layer. For example, wire 201 may include a first coating layer of palladium over a copper core, a sacrificial layer of zinc over the first palladium layer, and a second coating layer of palladium over the sacrificial layer.

Forces provided by a capillary may result in example openings 218, 216, 212, 214 being formed in one or more of layers 208, 210. Although four openings are illustrated in FIG. 2, more, fewer, and/or different openings may be present in a given configuration of semiconductor device 200.

For example, semiconductor device 200 may include example openings 218, 216 in layer 210 on a first side of stitch bond 206. Openings 218, 216 may result in the exposure of portions of layer 208. Semiconductor device 200 may also include example openings 212, 214 on a second side of stitch bond 206. Opening 214 may be an opening in layer 208 and opening 212 may be an opening in layer 210. Openings 212, 214 may result in exposure of certain portions of layer 210 as well as certain portions of core material 204.

With reference to openings 218, 216, layer 208 may act as an additional barrier for core material 204, reducing the potential oxidation of core material 204. Openings 218, 216 may result in oxidation of the sacrificial layer (whether it is present as layer 208 or as layer 210). With reference to openings 212, 214, portions of core material 204 may be exposed. In such a configuration, the sacrificial layer may act to reduce oxidation of core material 204 by being more chemically active than core material 204, thus providing an easier oxidation target than core material 204. Oxidation of core material 204 may thus be reduced even when the stresses of the bonding process are sufficient to create openings in layers 208, 210.

Although FIG. 2 illustrates an example semiconductor device 200 including stitch bond 206, other wire bonding processes may be used without departing from the scope of the present disclosure.

Figure 3:
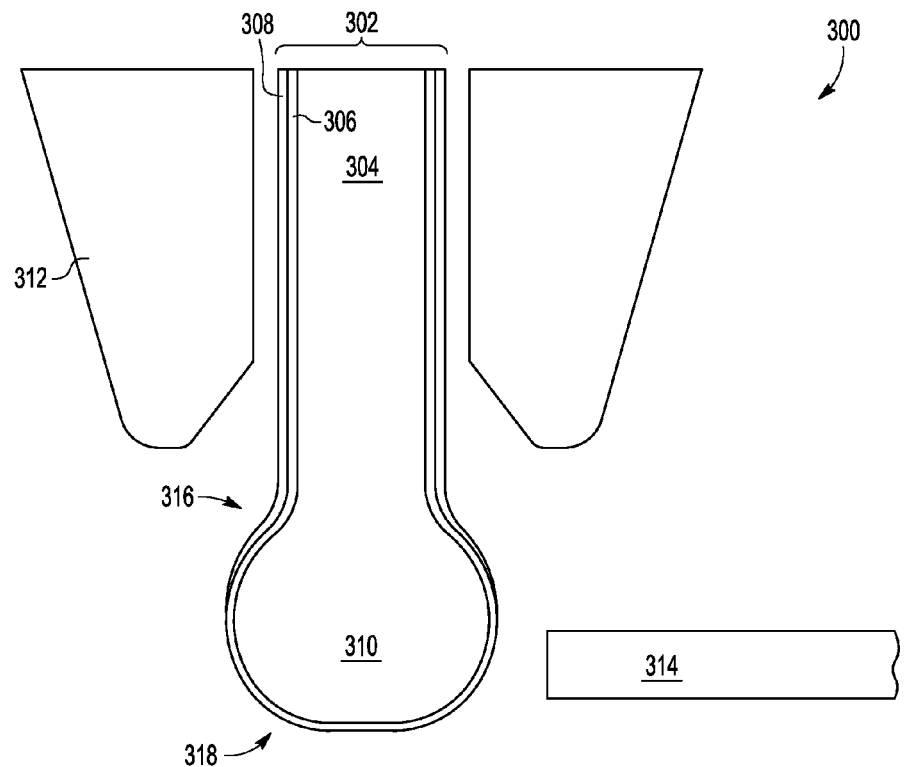
FIG. 3 illustrates an example ball bonding structure operable to create a free air ball proximal to an end of a wire, in accordance with certain embodiments of the present disclosure.

FIG. 3 illustrates an example ball bonding structure 300 operable to create a free air ball 310 proximal to an end 318 of wire 302, in accordance with certain embodiments of the present disclosure. In some embodiments, structure 300 may include capillary 312 and wire enlarging mechanism 314. As described in more detail above with reference to FIG. 1, ball bond 106 may be formed by the application of force by capillary 312 pressing down on portions of free air ball 310 formed from portions of wire 302.

Capillary 312 may be any appropriate structure operable to direct free air ball 310 such that free air ball 310 may be bonded to bond pad 126. For example, capillary 312 may include a chamfer surrounding wire 302, wherein the outer surface of the chamfer tapers toward free air ball 310 proximal to region 316 of wire 302. Once free air ball 310 comes into contact with bond pad 126, capillary 312 may deform some or all of free air ball 310 in order to facilitate bonding to bond pad 126, resulting in ball bond 106.

In some embodiments, free air ball 310 may of a substantially spherical and/or substantially symmetrical shape formed as a result of melting a portion of wire 302. Such melting may be the result of an electrical spark produced by wire enlarging mechanism 314 and/or the ionization of the air gap between wire 302 and wire enlarging mechanism 314. In some embodiments, wire enlarging mechanism 314 may be an electronic flame-off ("EFO") wand present within wire bonding machinery.

As described in more detail above with reference to FIG. 1, wire 302 may include a central core material 304 covered in a plurality of layers 306, 308. Core material 304 may be any appropriate conductive material, including copper, silver, and/or their alloys. Core material 304 may be a material that is susceptible to corrosion. Core material 304 may be covered in a plurality of layers 306, 308. One of layers 306, 308 may be a sacrificial coating layer composed substantially of a material that is more chemically active than core material 304. For example, if core material 304 is copper, then the sacrificial coating layer may be composed substantially of zinc, aluminum, magnesium, or other material more chemically active than copper. The other of layers 306, 308 may be a coating layer composed substantially of a material that is less chemically active than core material 304. For example, if core material 304 is copper, then the coating layer may be composed substantially of palladium.

In some embodiments, layer 306 may be the sacrificial layer. For example, wire 302 may include a layer of zinc over core material 304. The layer of zinc may be of any appropriate thickness such that a sacrificial layer is provided while still being able to be selectively removed, as described in more detail below with reference to FIG. 2. For example, the layer of zinc may be approximately 0.05-0.20 microns thick. In a configuration in which layer 306 is the sacrificial layer, layer 308 may be the coating layer. For example, wire 302 may include a layer of palladium over the layer of zinc.

In the same or alternative embodiments, layer 308 may be the sacrificial layer. In such a configuration, layer 306 may be the coating layer. For example, wire 302 may include a layer of palladium over core material 304 and a layer of zinc over the layer of palladium. The layer of zinc may be of any appropriate thickness such that a sacrificial layer is provided while still being able to be selectively removed, as described in more detail below with reference to FIG. 3. For example, the layer of zinc may be approximately 0.05-0.20 microns thick.

In still further embodiments, layers 306, 308 may include a plurality of other layers. For example, as described in more detail below with reference to FIG. 4, wire 302 may include a first coating layer over core material 304, a sacrificial layer over the first coating layer, and a second coating layer over the sacrificial layer. For example, wire 302 may include a first coating layer of palladium over a copper core, a sacrificial layer of zinc over the first palladium layer, and a second coating layer of palladium over the sacrificial layer.

In some embodiments, wire enlarging mechanism 314 may have a plurality of parameters that may be varied in order to selectively remove portions of one or more of layers 306, 308. For example, wire enlarging mechanism 314 may have a variable current, a variable gas flow rate, and/or a variable exposure time. By varying these parameters, certain portions of one or more of layers 306, 308 may be selectively removed. For example, a K&S IConn bonding machine may be able to selectively remove a bottom portion (e.g., a portion proximal to end 318) of a palladium coating layer overlying a copper wire core using a gas flow rate of less than 0.81 liter/min using various combinations of electric flame-off current and time (e.g., 3200 mA for 340 μs).

As part of a wire enlarging process to form free air ball 310, the parameters of wire enlarging mechanism 314 may be set such that layer 308 may be removed over a portion of free air ball 310 proximal to end 318. In some embodiments, layer 306 may also be reduced in thickness relative to the thickness of layer 306 in region 316. In such a manner, one or more of layers 306, 308 may be removed under free air ball 310 prior to its use in forming ball bond 106.

For example, in configurations in which layer 308 includes a sacrificial layer (e.g., zinc) and layer 306 includes a coating layer (e.g., palladium), wire enlarging mechanism 314 may be configured to remove the sacrificial layer over a portion of free air ball 310 proximal to end 318 while leaving some, all, or none of the coating layer over the same portion of free air ball 310. In such a configuration, the sacrificial layer may remain on the free air ball proximal to region 316. This may allow the sacrificial layer to be on a top portion of ball bond 106 (e.g., allowing for the sacrificial layer to reduce oxidation of core material 304) but substantially absent from a bottom portion of ball bond 106 (e.g., between ball bond 106 and bond pad 126). This may allow for a reduction in oxidation of core material 304 while reducing interference with the wire bonding process.

As another example, in configurations in which layer 306 includes a sacrificial layer (e.g., zinc) and layer 308 includes a coating layer (e.g., palladium), wire enlarging mechanism 314 may be configured to remove substantially all of layers 306, 308 over a portion of free air ball 310 proximal to end 318.

In some embodiments, one or more of layers 306, 308 may include a plurality of additional layers. In such embodiments, wire enlarging mechanism 314 may be configured to selectively remove portions of one or more of these additional layers over a portion of free air ball 310.

Figure 4:
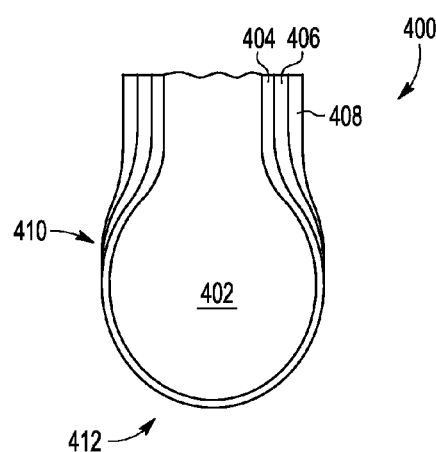
FIG. 4 illustrates an example cross-section of a free air ball including a base material, a first coating layer over the base material, a sacrificial layer over the first coating layer, and a second coating layer over the sacrificial layer, in accordance with certain embodiments of the present disclosure.

FIG. 4 illustrates an example cross-section of free air ball 400 including a base material 402, a first coating layer 404 over base material 402, a sacrificial layer 406 over first coating layer 404, and a second coating layer 408 over sacrificial layer 406, in accordance with certain embodiments of the present disclosure. As described in more detail above with reference to FIGS. 1 and 3, a wire may include a core material covered in a plurality of layers. The wire may then be subjected to a wire enlarging process (e.g., via wire enlarging mechanism 314 as referenced in FIG. 3), creating a free air ball at one end of the wire. As part of the wire enlarging process, portions of one or more of the layers may be removed over certain portions of the core material.

Referring again to FIG. 4, in some embodiments free air ball 400 may include a first coating layer 404 over base material 402. First coating layer 404 may have a first thickness in region 410 and a second thickness in region 412. In some configurations, this may be the result of the wire enlarging process, as described in more detail above with reference to FIG. 3. It may be desirable to have a portion of first coating layer 404 remain in region 412 in order to be present in region 412 of free air ball 400 during the wire bonding process.

In some embodiments, free air ball 400 may also include sacrificial layer 406 over first coating layer 404. Sacrificial layer 406 may be composed substantially of a material that is more chemically active than core material 402. For example, if core material 402 is copper, then the sacrificial coating layer may be composed substantially of zinc, aluminum, magnesium, or other material more chemically active than copper.

Coating layers 404, 406 may be composed substantially of a material that is less chemically active than core material 402. For example, if core material 402 is copper, then first coating layer and/or second coating layer may be composed substantially of palladium.

In some embodiments, a portion of first coating layer 404 may remain in region 412 in order to be present in region 412 of free air ball 400 during the wire bonding process. In the same or alternative embodiments, substantially all of layers 404, 406, 408 may be removed from region 412. When some portion of first coating layer 404 remains, it may be used to aid in the formation of an intermetallic compound between the ball bond and bond pad.

Although three layers 404, 406, 408 are illustrated, more, fewer, and/or different layers may be present without departing from the scope of the present disclosure. For example, adhesion promotion layers may be present between the sacrificial layer and one or more of the coating layers. As an additional example, one or more of layers 404, 406, 408 may include a plurality of additional layers.

Figure 5:
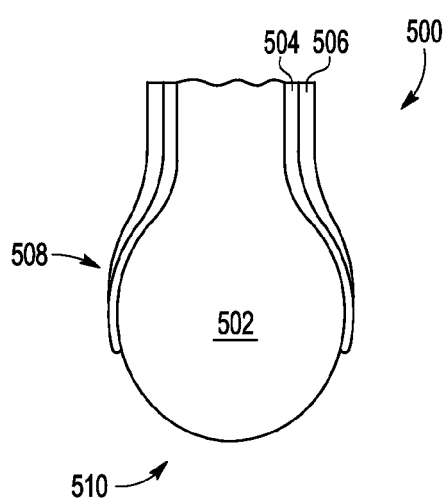
FIG. 5 illustrates an example cross-section of a free air ball including a base material, a sacrificial layer over the base material, and a coating layer over the sacrificial layer, in accordance with certain embodiments of the present disclosure.

FIG. 5 illustrates an example cross-section of free air ball 500 including a base material 502, sacrificial layer 504 over base material 502, and coating layer 506 over sacrificial layer 504, in accordance with certain embodiments of the present disclosure. As described in more detail above with reference to FIGS. 1 and 3, a wire may include a core material covered in a plurality of layers. The wire may then be subjected to a wire enlarging process (e.g., via wire enlarging mechanism 314 as referenced in FIG. 3), creating a free air ball at one end of the wire. As part of the wire enlarging process, portions of one or more of the layers may be removed over certain portions of the core material.

Referring again to FIG. 5, in some embodiments free air ball 500 may include a sacrificial layer 504 over base material 502. Sacrificial layer 504 may have a first thickness in region 508 and a second thickness in region 510. In some configurations, this may be the result of the wire enlarging process, as described in more detail above with reference to FIG. 3. It may be desirable to remove substantially all of sacrificial layer 504 in region 510 so that sacrificial layer 504 does not interfere with the wire bonding process.

Sacrificial layer 504 may be composed substantially of a material that is more chemically active than core material 502. For example, if core material 502 is copper, then the sacrificial coating layer may be composed substantially of zinc, aluminum, magnesium, or other material more chemically active than copper.

In some embodiments, free air ball 500 may also include coating layer 506 over sacrificial layer 504. Coating layer 506 may be composed substantially of a material that is less chemically active than core material 502. For example, if core material 502 is copper, then coating layer 506 may be composed substantially of palladium.

In some embodiments, a portion of coating layer 506 may remain in region 508 in order to be present in region 510 of free air ball 500 during the wire bonding process. In the same or alternative embodiments, substantially all of layers 504, 506 may be removed from region 510. When some portion of coating layer 506 remains, it may be used to aid in the formation of a intermetallic compound between the ball bond and bond pad.

Although two layers 504, 506 are illustrated, more, fewer, and/or different layers may be present without departing from the scope of the present disclosure. For example, adhesion promotion layers may be present between the sacrificial layer and one or more of the coating layers. As an additional example, a barrier layer may be present between sacrificial layer 504 and core material 502. As a further example, one or more of layers 504, 506 may include a plurality of additional layers.

Figure 6:
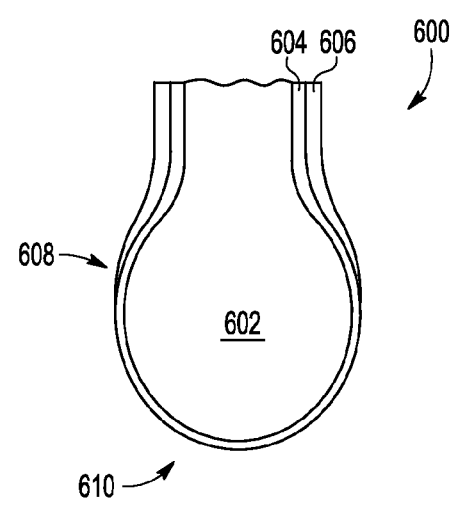
FIG. 6 illustrates an example cross-section of a free air ball including a base material, a coating layer over the base material, and a sacrificial layer over the coating layer, in accordance with certain embodiments of the present disclosure.

FIG. 6 illustrates an example cross-section of free air ball 600 including a base material 602, coating layer 604 over base material 602, and sacrificial layer 606 over coating layer 604, in accordance with certain embodiments of the present disclosure. As described in more detail above with reference to FIGS. 1 and 3, a wire may include a core material covered in a plurality of layers. The wire may then be subjected to a wire enlarging process (e.g., via wire enlarging mechanism 314 as referenced in FIG. 3), creating a free air ball at one end of the wire. As part of the wire enlarging process, portions of one or more of the layers may be removed over certain portions of the core material.

Referring again to FIG. 6, in some embodiments free air ball 600 may include a coating layer 604 over base material 602. Coating layer 604 and sacrificial layer 606 may each have a first thickness in region 608 and a second thickness in region 610. In some configurations, this may be the result of the wire enlarging process, as described in more detail above with reference to FIG. 3. It may be desirable to remove substantially all of sacrificial layer 606 in region 610 so that sacrificial layer 606 does not interfere with the wire bonding process.

Sacrificial layer 606 may be composed substantially of a material that is more chemically active than core material 602. For example, if core material 602 is copper, then the sacrificial coating layer may be composed substantially of zinc, aluminum, magnesium, or other material more chemically active than copper.

In some embodiments, free air ball 600 may also include coating layer 604 over sacrificial layer 606. Coating layer 604 may be composed substantially of a material that is less chemically active than core material 602. For example, if core material 602 is copper, then coating layer 604 may be composed substantially of palladium.

In some embodiments, a portion of coating layer 604 may remain in region 608 in order to be present in region 610 of free air ball 600 during the wire bonding process. In the same or alternative embodiments, substantially all of layers 604, 606 may be removed from region 610. When some portion of coating layer 604 remains, it may be used to aid in the formation of an intermetallic compound between the ball bond and bond pad.

Although two layers 604, 606 are illustrated, more, fewer, and/or different layers may be present without departing from the scope of the present disclosure. For example, adhesion promotion layers may be present between the sacrificial layer and one or more of the coating layers. As an additional example, one or more of layers 604, 606 may include a plurality of additional layers.

By now it should be appreciated that there has been provided a coated wire for use in wire bonding processes of semiconductor devices that may reduce the oxidation of the conductive material forming the core of the wire, as well as methods for creating wire bonds using the coated wire.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, more, fewer, or different layers may be present within a given wire without departing from the scope of the present disclosure so long as a sacrificial layer is also provided. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

A semiconductor device (100, 200) is disclosed. The semiconductor device may include a bond (106, 206) formed on a bond pad (116, 202), the bond may be formed of a wire that may include a central core of conductive metal (104, 204, 304, 402, 502, 602), a first coating (108 or 110, 208 or 210, 306 or 308, 404 or 406, 504 or 506, 606 or 604) over the central core of conductive metal that is more chemically active than the conductive metal, and a second coating (110 or 108, 210 or 208, 308 or 306, 406 or 404, 506 or 504, 604 or 606) over the central core of conductive metal that is less chemically active than the central core of conductive metal.

In some embodiments of the device the first coating (604) may be directly over and in contact with the central core of conductive metal, the second coating (606) may be directly over and in contact with the first coating, and the first coating may include at least one of a group consisting of zinc, aluminum, magnesium, and the second coating includes palladium.

In such a configuration, the second coating (504) may be directly over and in contact with the central core of conductive metal, the first coating (506) may be directly over and in contact with the second coating, and the first coating may include at least one of a group consisting of zinc, aluminum, magnesium, and the second coating includes palladium.

In some embodiments of the device, the central core of conductive metal may include at least one of a group consisting of copper and silver.

In the same or alternative embodiments, the bond may be one of a group consisting of a ball bond (106), a wedge bond, and a stitch bond (206). In such a configuration, an interface between the central core of conductive metal and the bond pad may be devoid of the first coating, and the second coating may be between the bond pad and the central core of conductive metal.

In some embodiments of the device, the wire may further include a third coating (408) over the central core of conductive metal, (402) the third coating is less chemically active than the central core of conductive metal. In such a configuration, the second coating (404) may be directly over and in contact with the central core of conductive metal, the first coating (406) may be directly over and in contact with the second coating, the third coating may be directly over and in contact with the first coating, and the third coating may include palladium.

A semiconductor device (100, 200) is also disclosed that may include: a packaging mold compound (222); a wire bond (106, 206) embedded in the packaging mold compound, wherein a wire of the wire bond may include a central core of electrically conductive material (104, 204, 304, 402, 502, 602), a sacrificial coating over the central core of conductive material (108 or 110, 208 or 210, 306 or 308, 404 or 406, 504 or 506, 606 or 604), and a second coating (110 or 108, 210 or 208, 308 or 306, 406 or 404, 506 or 504, 604 or 606) over the central core of conductive material, and the sacrificial coating is formed of a material that has a lower reduction potential than the central core of conductive material and the second coating, and the second coating has a higher reduction potential than the central core of conductive material.

In some embodiments of the device, an interface between the central core and the bond pad may be devoid of the sacrificial coating, and the second coating may be between the bond pad and the central core of conductive metal.

In some embodiments, a thickness of the sacrificial coating is between 0.05 and 0.20 micrometers.

In the same or alternative embodiments, the bond is one of a group consisting of a ball bond (106), a wedge bond, and a stitch bond (206). Further, the sacrificial coating may include one of group consisting of zinc, aluminum, and magnesium.

In some embodiments, the second coating may include palladium. In such a configuration, the sacrificial coating may be in direct contact with the central core of electrically conductive material and the second coating may be in direct contact with the sacrificial coating.

In the same or alternative embodiments, the central core of electrically conductive material includes at least one of a group consisting of copper and silver.

In some embodiments, the device further includes a third coating (404), wherein the second coating (404) may be in direct contact with the central core of electrically conductive material and the sacrificial coating (406) may be between the second coating and the third coating.

In such a configuration, the third coating has a higher reduction potential than the central core of conductive material.

A method of making a semiconductor device is also disclosed. The method may include forming a plurality of bonds on a corresponding plurality of bond pads using wire that includes a core of conductive material (104, 204, 304, 402, 502, 602), a first coating (108 or 110, 208 or 210, 306 or 308, 404 or 406, 504 or 506, 606 or 604) over the core, and a second coating (110 or 108, 210 or 208, 308 or 306, 406 or 404, 506 or 504, 604 or 606) directly over the first coating, wherein the first coating has a lower reduction potential than the core and the second coating has a higher reduction potential than the core.

In some embodiments of the method, the wire may further include a third coating (408) between the core and the first coating, wherein the third coating is directly over the core and has a higher reduction potential than the core.

What is claimed is:

1. A semiconductor device comprising:
a packaging mold compound;
a wire bond embedded in the packaging mold compound, wherein
a wire of the wire bond includes a central core of electrically conductive material, a sacrificial coating over the central core of electrically conductive material, and a second coating over the central core of conductive material, and
the central core of electrically conductive material includes at least one of a group consisting of copper and silver, and the sacrificial coating is formed of a material that has a lower reduction potential than the central core of electrically conductive material and the second coating, and the second coating has a higher reduction potential than the central core of electrically conductive material.

2. The device of claim 1, wherein an interface between the central core and a bond pad is devoid of the sacrificial coating, and the second coating is between the bond pad and the central core of electrically conductive material.

3. The device of claim 2, wherein the sacrificial coating is in direct contact with the central core of electrically conductive material and the second coating is in direct contact with the sacrificial coating.

4. The device of claim 1, wherein a thickness of the sacrificial coating is between 0.05 and 0.20 micrometers.

5. The device of claim 1, wherein the bond is one of a group consisting of a ball bond, a wedge bond, and a stitch bond.

6. The device of claim 1, wherein the sacrificial coating includes one of group consisting of zinc, aluminum, and magnesium.

7. The device of claim 1, wherein the second coating includes palladium.

8. A semiconductor device comprising:
a packaging mold compound; and
a wire bond embedded in the packaging mold compound, wherein a wire of the wire bond includes:
   a central core of electrically conductive material,
   a sacrificial coating over the central core of electrically conductive material,
   a second coating over the central core of conductive material, and
   a third coating, and
   the sacrificial coating is formed of a material that has a lower reduction potential than the central core of electrically conductive material and the second coating, and the second coating has a higher reduction potential than the central core of electrically conductive material, and the second coating is in direct contact with the central core of electrically conductive material, and the sacrificial coating is between the second coating and the third coating.

9. The device of claim 8, wherein an interface between the central core and a bond pad is devoid of the sacrificial coating, and the second coating is between the bond pad and the central core of electrically conductive material.

10. The device of claim 9, wherein the sacrificial coating is in direct contact with the central core of electrically conductive material and the second coating is in direct contact with the sacrificial coating.

11. The device of claim 8, wherein a thickness of the sacrificial coating is between 0.05 and 0.20 micrometers.

12. The device of claim 8, wherein the bond is one of a group consisting of a ball bond, a wedge bond, and a stitch bond.

13. The device of claim 8, wherein the sacrificial coating includes one of group consisting of zinc, aluminum, and magnesium.

14. The device of claim 8, wherein the second coating includes palladium.

15. A semiconductor device comprising:
a packaging mold compound; and
a wire bond embedded in the packaging mold compound, wherein a wire of the wire bond includes:
   a central core of electrically conductive material, a sacrificial coating over the central core of electrically conductive material, a second coating over the central core of conductive material, and a third coating, and
   the sacrificial coating is formed of a material that has a lower reduction potential than the central core of electrically conductive material and the second coating, and the second and third coatings have a higher reduction potential than the central core of electrically conductive material, and the second coating is in direct contact with the central core of electrically conductive material, and the sacrificial coating is between the second coating and the third coating.

16. The device of claim 15, wherein an interface between the central core and a bond pad is devoid of the sacrificial coating, and the second coating is between the bond pad and the central core of electrically conductive material.

17. The device of claim 15, wherein the bond is one of a group consisting of a ball bond, a wedge bond, and a stitch bond.

18. The device of claim 15, wherein the central core of electrically conductive material includes at least one of a group consisting of copper and silver.

19. The device of claim 15, wherein the second coating includes palladium.

* * * * *